(12) United States Patent
Kim et al.

(10) Patent No.: US 10,224,086 B2
(45) Date of Patent: Mar. 5, 2019

(54) MEMORY DEVICE WITH TEMPERATURE-DEPENDENT READING OF A REFERENCE CELL

(71) Applicant: SAMSUNG ELECTRONICS CO., LTD., Suwon-si, Gyeonggi-Do (KR)

(72) Inventors: Dae-Shik Kim, Hwaseong-si (KR); Suk-Soo Pyo, Hwasung-si (KR); Gwan-Hyeob Koh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/816,810

(22) Filed: Nov. 17, 2017

(65) Prior Publication Data

US 2018/0301178 A1 Oct. 18, 2018

(30) Foreign Application Priority Data

Apr. 13, 2017 (KR) .................. 10-2017-0048037

(51) Int. Cl.
| | |
|---|---|
| *G11C 7/04* | (2006.01) |
| *G11C 11/16* | (2006.01) |
| *H01L 27/22* | (2006.01) |
| *H01L 43/10* | (2006.01) |
| *H01L 43/08* | (2006.01) |

(52) U.S. Cl.
CPC ........ *G11C 11/1673* (2013.01); *G11C 11/161* (2013.01); *H01L 27/228* (2013.01); *H01L 43/08* (2013.01); *H01L 43/10* (2013.01)

(58) Field of Classification Search
CPC .................................................. G11C 11/1673

USPC .......................................................... 365/211
See application file for complete search history.

(56) References Cited

U.S. PATENT DOCUMENTS

| | | | |
|---|---|---|---|
| 6,990,015 B2 | 1/2006 | Honda et al. | |
| 7,027,325 B2 | 4/2006 | Iwata | |
| 7,057,958 B2 | 6/2006 | So et al. | |
| 2001/0026490 A1* | 10/2001 | Nakagawa | G11C 7/04 365/207 |
| 2009/0290428 A1 | 11/2009 | Noh | |
| 2010/0061141 A1 | 3/2010 | Hwang | |
| 2010/0091562 A1* | 4/2010 | Chen | G11C 7/04 365/171 |
| 2014/0104933 A1 | 4/2014 | Yamahira | |
| 2015/0070969 A1* | 3/2015 | Hatsuda | G11C 13/004 365/148 |
| 2015/0270006 A1* | 9/2015 | Yoo | G11C 16/28 365/185.21 |
| 2016/0099049 A1 | 4/2016 | Lee et al. | |
| 2016/0211030 A1 | 7/2016 | Chen et al. | |
| 2017/0052551 A1* | 2/2017 | Bang | G06F 3/0659 |

\* cited by examiner

*Primary Examiner* — Hoai V Ho
(74) *Attorney, Agent, or Firm* — Volentine, Whitt & Francos, PLLC

(57) ABSTRACT

A memory device includes at least one reference cell and multiple memory cells. A method of operating the memory device may include detecting a temperature of the memory device and controlling a level of a first read signal applied to the at least one reference cell in accordance with a result of the detecting of the temperature. The method may also include comparing a first sensing value sensed by applying the first read signal to the at least one reference cell with a second sensing value sensed by applying a second read signal to a selected memory cell among the multiple memory cells.

20 Claims, 14 Drawing Sheets

MEMORY DEVICE WITH TEMPERATURE-DEPENDENT READING OF A REFERENCE CELL

CROSS-REFERENCE TO RELATED APPLICATION

This U.S. non-provisional patent application claims priority under 35 U.S.C. 119 to Korean Patent Application No. 10-2017-0048037, filed on Apr. 13, 2017 in the Korean Intellectual Property Office, the disclosure of which is incorporated herein in its entirety by reference.

BACKGROUND

The present disclosure relates to a magnetoresistive memory device. More particularly, the present disclosure relates to a magnetoresistive memory device executing temperature compensation, a magnetoresistive memory system that includes such a magnetoresistive memory device, and a method of operating the magnetoresistive memory device.

Research on non-volatile and refresh-free next generation memory devices is underway in response to high capacity and low power consumption of memory devices. Next generation memory devices are required to have high integration of dynamic RAMs (DRAMs), non-volatility of flash memories, and high speed of static RAMs (SRAMs). Phase change RAMs (PRAMs), nano floating gate memories (NF-GMs), polymer RAMs (PoRAMs), magnetoresistive RAMs (MRAMs), ferroelectric RAMs (FeRAMs), and the like are addressed as next generation memory devices meeting the requirements described above.

SUMMARY

The present disclosure describes a magnetoresistive memory device, a magnetoresistive memory system that includes such a magnetoresistive memory device, and a method of operating the magnetoresistive memory device. More particularly, the present disclosure describes a magnetoresistive memory device capable of controlling a read operation based on a temperature change, a magnetoresistive memory system that includes such a magnetoresistive memory device, and a method of operating the magnetoresistive memory device.

According to an aspect of the present disclosure, a memory device includes at least one reference cell and a multiple memory cells. A method of operating the memory device may include detecting a temperature of the memory device. The method may include controlling a level of a first read signal applied to the at least one reference cell in accordance with a result of the detecting temperature. The method may also include comparing a first sensing value sensed by applying the first read signal to the at least one reference cell with a second sensing value sensed by applying a second read signal to a memory cell selected from the multiple memory cells.

According to another aspect of the present disclosure, a memory device includes a memory cell array including at least one reference cell and multiple memory cells. The memory device also includes a temperature sensor configured to detect a temperature of the memory device, and a reference cell bias generator configured to change, in accordance with the detecting the temperature, a level of a first read signal applied to the at least one reference cell from a reference value to a first value when the temperature increases and the level of the first read signal from the reference value to a second value different from the first value when the temperature decreases. The memory device also includes a sensing amplifier configured to compare a first sensing value output from the at least one reference cell based on the first read signal with a second sensing value output from a selected memory cell among the multiple memory cells based on the second read signal.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
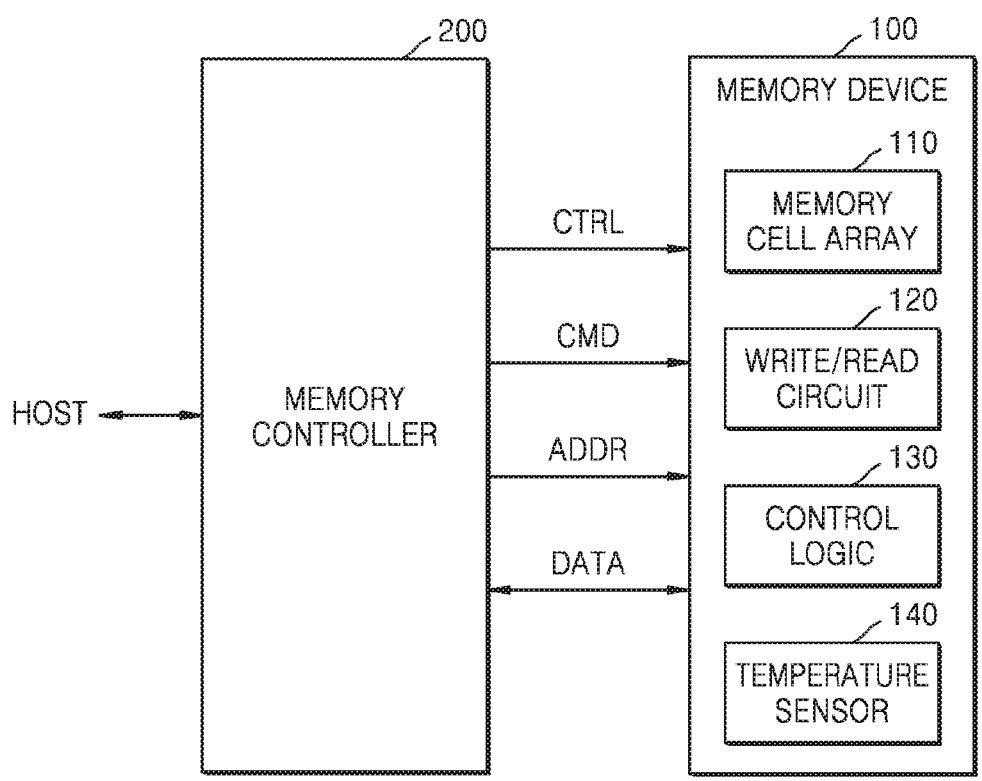
FIG. 1 is a block diagram of a memory system including a memory device, according to an example embodiment of the present disclosure.

FIG. 1 is a block diagram of a memory system 10 including a memory device 100, according to an example embodiment of the present disclosure.

Referring to FIG. 1, the memory system 10 may include the memory device 100 and a memory controller 200. The memory device 100 may include a memory cell array 110, a write/read circuit 120, a control logic 130, and a temperature sensor 140. When the memory cell array 110 includes magnetoresistive memory cells, the memory system 10 may be referred to as a magnetoresistive memory system.

The memory controller 200 may control the memory device 100 to read data stored in the memory device 100 or to write data to the memory device 100 in response to a write/read request from a host HOST. The memory controller 200 may control program (or write), read, and erase operations of the memory device 100 by providing an address ADDR, a command CMD, and a control signal CTRL to the memory device 100. In addition, data to be written and data to be read may be transferred between the memory controller 200 and the memory device 100.

Although not illustrated, the memory controller 200 may include random access memory (RAM), a processing unit (processor), a host interface, and a memory interface. The RAM may be used as an operating memory of the processing unit (processor). The processing unit (processor) may control an operation of the memory controller 200 by executing instructions stored in the RAM or in another memory. When executed by the processing unit (processor), the instructions may cause the memory controller 200 to perform one or more of the process steps described herein. The host interface may include a protocol for exchanging data between the host HOST and the memory controller 200. For example, the memory controller 200 may be configured to communicate with the outside, for example the host HOST, via at least one of various interface protocols such as universal serial bus (USB), MultiMediaCard (MMC), peripheral component interconnect express (PCI-E), advanced technology attachment (ATA), serial-ATA, parallel-ATA, small computer system interface (SCSI), enhanced small disk interface (ESDI), and integrated drive electronics (IDE).

The memory cell array 110 may include multiple memory cells (not illustrated) respectively arranged in regions where multiple first signal lines and multiple second signal lines cross each other. According to an example embodiment, the multiple first signal lines may be multiple bit lines and the multiple second signal lines may be multiple of word lines. According to another example embodiment, the multiple first signal lines may be the multiple word lines and the multiple second signal lines may be the multiple bit lines.

In addition, each of the multiple memory cells may be a single level cell (SLC) storing data of one bit or a multi-level cell (MLC) capable of storing data of at least two bits. Alternatively, the memory cell array 110 may include both the SLC and the MLC. When data of one bit is written to one memory cell, the memory cells may have two resistance level dispersions depending on the written data. Alternatively, when data of two bits is written to one memory cell, the memory cells may have four resistance level dispersions depending on the written data. Alternatively, in the case of a triple level cell (TLC) in which data of three bits is stored in one memory cell, the memory cells may have eight resistance level dispersions depending on the written data, according to another embodiment. However, the present disclosure is not limited thereto. According to another embodiment, the memory cell array 110 may include memory cells capable of storing data of at least four bits.

In addition, the memory cell array 110 may include memory cells of a two-dimensional (2D) horizontal structure, according to an example embodiment. According to another example embodiment, the memory cell array 110 may include memory cells of a 3D vertical structure.

The memory cell array 110 may include resistive memory cells including variable resistors (not illustrated). For example, when a variable resistor includes a phase change material (for example, GST or Ge—Sb—Te) and resistance changes with respect to temperature, a resistive memory device may be a phase change RAM (PRAM). As another example, when a variable resistor includes a top electrode, a bottom electrode, and a complex metal oxide therebetween, the resistive memory device may be a resistive RAM (RRAM). As another example, when a variable resistor includes the top electrode formed of a magnetic material, the bottom electrode formed of a magnetic material, and a dielectric therebetween, the resistive memory device may be a magnetoresistive RAM (MRAM).

The write/read circuit 120 may execute write and read operations to and from the memory cells. The write/read circuit 120 may be connected to the memory cells via the multiple bit lines and may include a write driver for writing data to the memory cells and a sensing amplifier for sensing data from the memory cells.

The control logic 130 may control an overall operation of the memory device 100 and may also control the write/read circuit 120 for executing memory operations such as writing and reading. For example, the memory device 100 may include a power generator (not illustrated) which generates various write voltages and read voltages used for write and read operations, and levels of the write voltages and the read voltages may be adjusted under the control of the control logic 130. As another example, the memory device 100 may include a reference signal generator (not illustrated) which generates various reference signals used in the read operation. For example, the reference signal generator may generate a reference current and/or a reference voltage. Levels of the reference current and/or the reference voltage may be adjusted under the control of the control logic 130.

In the write operation to the memory device 100, a resistance value of variable resistance of the memory cells of the memory cell array 110 may increase or decrease, depending on the write data. For example, each of the memory cells of the memory cell array 110 may have the resistance value depending on currently-stored data and the resistance value may increase or decrease depending on data to be written to each memory cell.

The read operation of the memory device 100 may be executed by various methods. In each read method, the read operation may be executed by using one or more read signals. When the read methods are different from each other, one or more read signals may be different from each other.

For example, in a current sensing method, a reference cell read voltage may be applied as a first read signal to the reference cell included in the memory cell array 110 and a memory cell read voltage may be applied as a second read signal to the memory cells included in the memory cell array 110, respectively. Then, data may be identified by comparing currents of sensing nodes caused by the reference cell read voltage and the memory cell read voltage, respectively.

For example, in a voltage sensing method, a reference cell read current may be applied as the first read signal to the reference cell included in the memory cell array 110 and a memory cell read current may be applied as the second read signal to the memory cells included in the memory cell array 110, respectively. Then, data may be identified by comparing voltages of sensing nodes caused by the reference cell read current and the memory cell read current, respectively.

According to an example embodiment of the present disclosure, the temperature sensor 140 may detect a temperature inside the memory device 100 and generate a detection signal. Ratios, as described herein, may be based on current values and temperatures as shown in FIG. 10B. For example, a predetermined linear correspondence between a current value of a reference cell and a temperature of the memory device 100 may be referenced to adjust the current value based on the temperature of the memory device 100. A ratio may therefore be, for example, a slope of the linear correspondence, so that a change in one value can be used to determine the change of the other, using the slope. Depending on a result of the detecting of the temperature, a read condition for the memory cell array 110 may be differently set and, for example, the first read signal may be changed depending on a first ratio in response to a temperature change. In other words, a condition under which data is read may be varied based on the temperature of the memory device 100. For example, a reference cell bias signal from a reference cell bias generator may be applied to a reference cell which is used for comparisons with memory cells. The values of data read from memory cells is determined based on the comparisons, and the reference cell bias signal may be varied based on the determined temperature of the memory device 100. As a result, the value of data read from memory cells may vary based on the comparisons, and therefore based on the temperature of the memory device 100. The first ratio may be, for example, any predetermined ratio. Various types of read methods may be applied for the read operation and different read signals that are different from each other may be adjusted with respect to each different read method.

The memory controller 200 and the memory device 100 may be integrated as one semiconductor device. For example, the memory controller 200 and the memory device 100 may be integrated as one semiconductor device to form a memory card. For example, the memory controller 200 and the memory device 100 may be integrated as a single semiconductor device and may be included in a PC card (PCMCIA), a compact flash card (CF), a smart media card (SM/SMC), a memory stick, a multi-media card (MMC, RS-MMC, or MMCmicro), a SD card (SD, miniSD, or microSD), a universal flash memory system (UFS), and the like. As another example, the memory controller 200 and the memory device 100 may be integrated as one semiconductor device to form a solid-state disk/drive (SSD).

Figure 2:
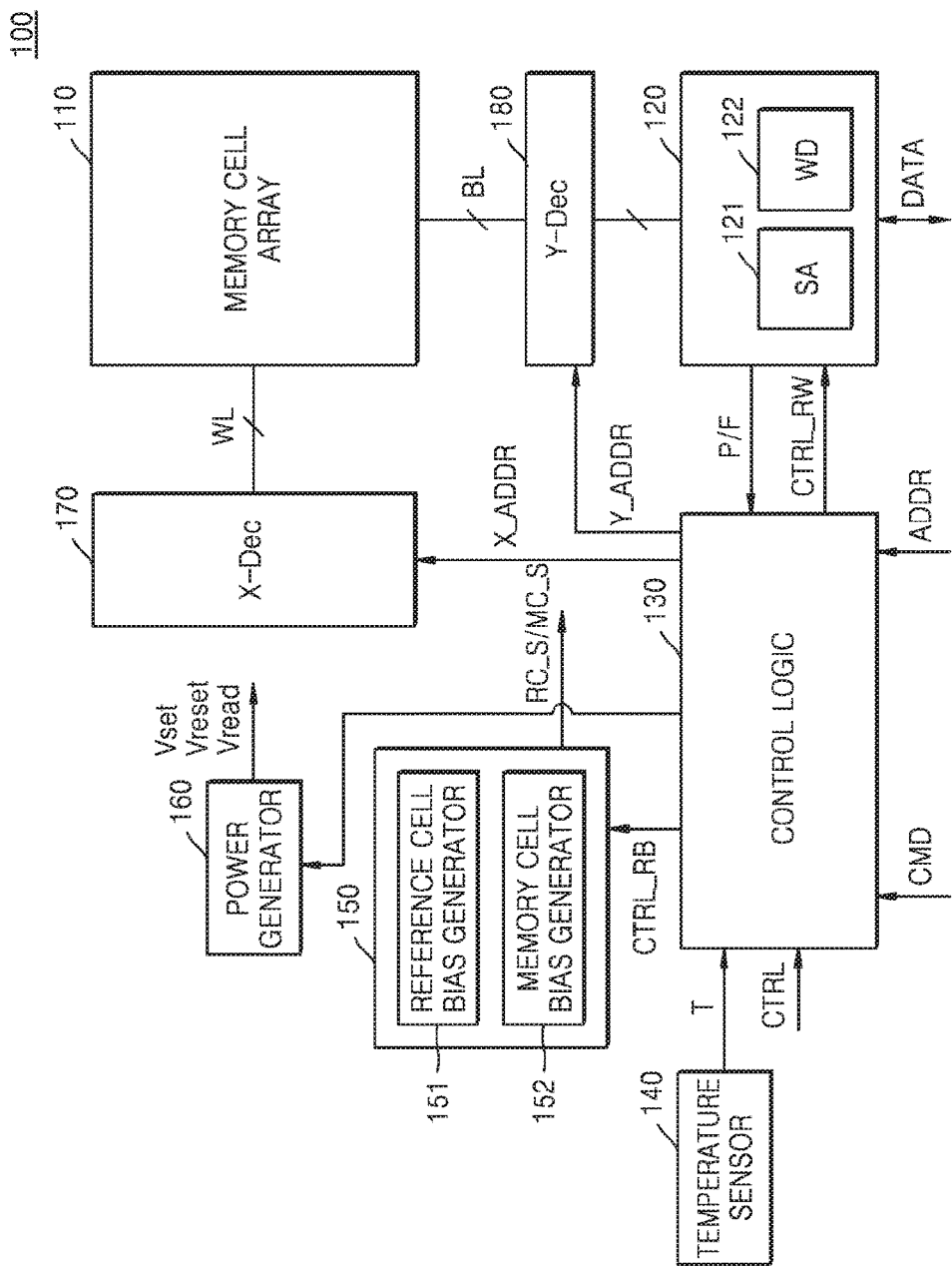
FIG. 2 is a block diagram of a memory device according to an example embodiment of the present disclosure.

FIG. 2 is a block diagram of a memory device according to an example embodiment of the present disclosure.

Referring to FIG. 2, the memory device 100 may include the memory cell array 110, the write/read circuit 120, the control logic 130, and the temperature sensor 140. In addition, the memory device 100 may further include a bias generator 150, a power generator 160, a row decoder 170, and a column decoder 180. The write/read circuit 120 may include a sensing amplifier 121 and a write driver 122. In addition, the bias generator 150 may further include a reference cell bias generator 151 and a memory cell bias generator 152.

The memory cells included in the memory cell array 110 may be connected to the multiple first signal lines and the multiple second signal lines. The multiple first signal lines may be bit lines BL and the multiple second signal lines may be word lines WL. Since various voltage signals or current signals are provided via the multiple bit lines BL and the word lines WL, data may be written to or read from selected memory cells, while write or read operations to or from other non-selected memory cells may be prevented.

The address ADDR for indicating a memory cell to be accessed with the command CMD may be received. The address ADDR may include a row address X_ADDR for selecting the word line WL of the memory cell array 110 and a column address Y_ADDR for selecting the bit line BL of the memory cell array 110. The row decoder 170 may execute a word line select operation in response to the row address X_ADDR and the column decoder 180 may execute a bit line select operation in response to the column address Y_ADDR.

The write/read circuit 120 may be connected to the bit lines BL for writing data to or reading data from the memory cells of the memory cell array 110. For example, at least a portion of the voltage signals or the current signals may be provided to the memory cell array 110 via the write/read circuit 120.

The control logic 130 may output various control signals CTRL_RW for writing data to the memory cell array 110 or reading data from the memory cell array 110 based on the command CMD, the address ADDR, and the control signal CTRL received from the memory controller (200 in FIG. 1). Thus, the control logic 130 may generally control various operations in the memory device 100.

The control logic 130 may output a bias control signal CTRL_RB based on a temperature information signal T output from the temperature sensor 140. According to an example embodiment, the bias control signal CTRL_RB may be a basis for a level change in the reference cell read signal RC_S.

The temperature sensor 140 may detect the temperature of the memory device 100 and output to the control logic 130 the temperature information signal T indicating the detected temperature. According to an example embodiment of the present disclosure, the read condition may be set differently depending on a result of the detecting of the temperature by the temperature sensor 140. For example, levels of various signals output from the bias generator 150 may be changed under the control of the control logic 130. In addition, at least one control signal from the control logic 130 may be provided to the write/read circuit 120 and the read condition may be changed via control of various components included in the write/read circuit 120.

According to another example embodiment, the temperature information signal T from the temperature sensor 140 may be directly provided to function blocks where a change in the read condition is applied with respect to the temperature change. For example, the detection signal from the temperature sensor 140 may be provided to the bias generator 150, the power generator 160, and the write/read circuit 120, respectively. At least one of various signals related to the read operation may be changed by the detection signal from the temperature sensor 140.

The bias generator 150 may generate the reference cell read signal RC_S and/or a memory cell read signal MC_S as various signals related to a data read operation. For example, in a data read operation, the sensing amplifier 121 may be connected to one node (for example, a sensing node) of the bit line BL for identifying data, and a data value may be determined by comparing a sensing value of the sensing node with the sensing value due to the reference cell read signal RC_S.

The bias generator 150 operations may include the reference cell bias generator 151 outputting the reference cell read signal RC_S and the memory cell bias generator 152 outputting the memory cell read signal MC_S. According to an example embodiment, the reference cell bias generator 151 may receive a reference cell bias control signal CTRL output from the control logic, change a level of the reference cell read signal RC_S based on the received reference cell bias control signal CTRL, and output a level-changed reference cell read signal RC_S.

According to an example embodiment of the present disclosure, various signals related to the read operation may be changed in various ways based on a result of the detecting of the temperature. For example, when data is read in accordance with the current sensing method, a level of the read voltage applied to the reference cell may be changed and output based on the temperature change. In addition, when data is read in accordance with the voltage sensing method, a level of the read current applied to the reference cell may be changed and output based on the temperature change. Detailed descriptions thereof will be provided below.

Figure 3A:
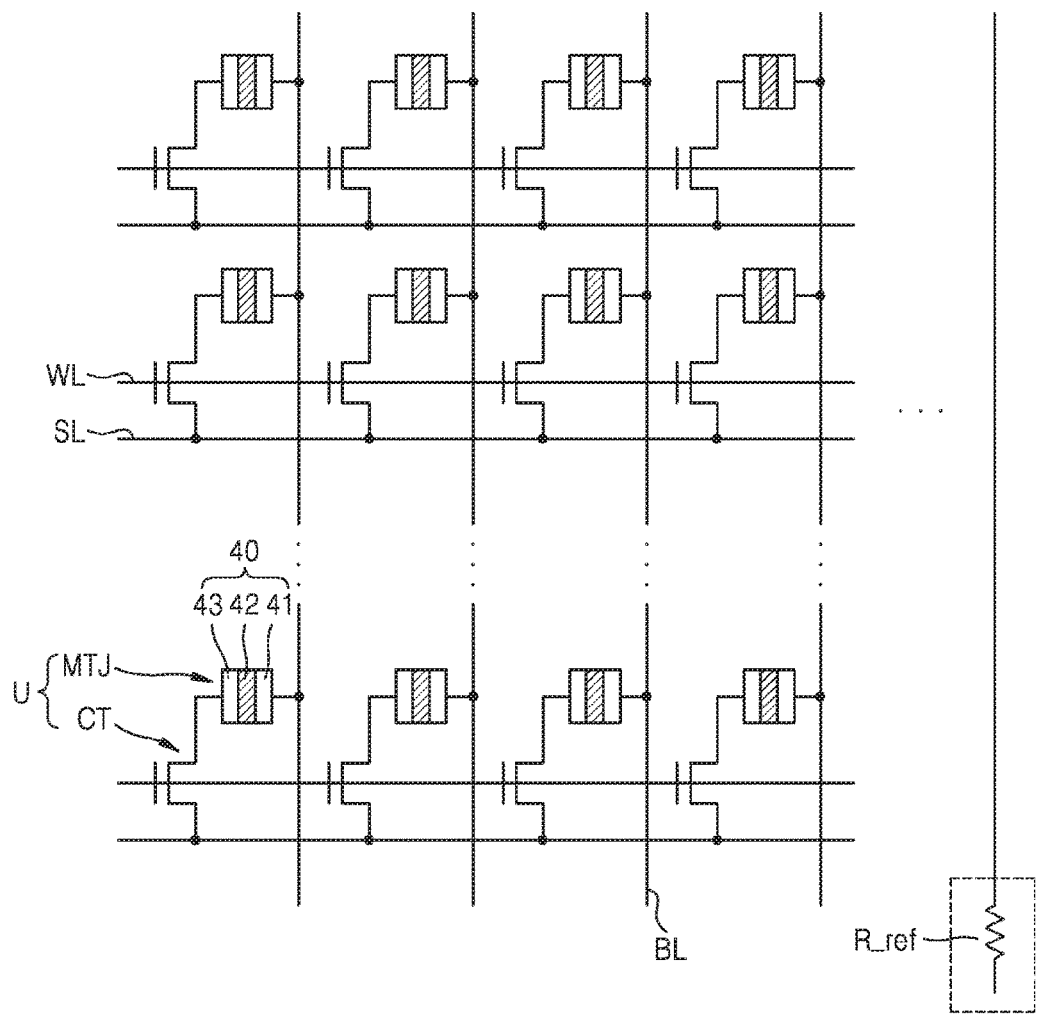
FIGS. 3A and 3B are respective circuit diagrams of a memory cell array in FIG. 2.
Figure 3B:
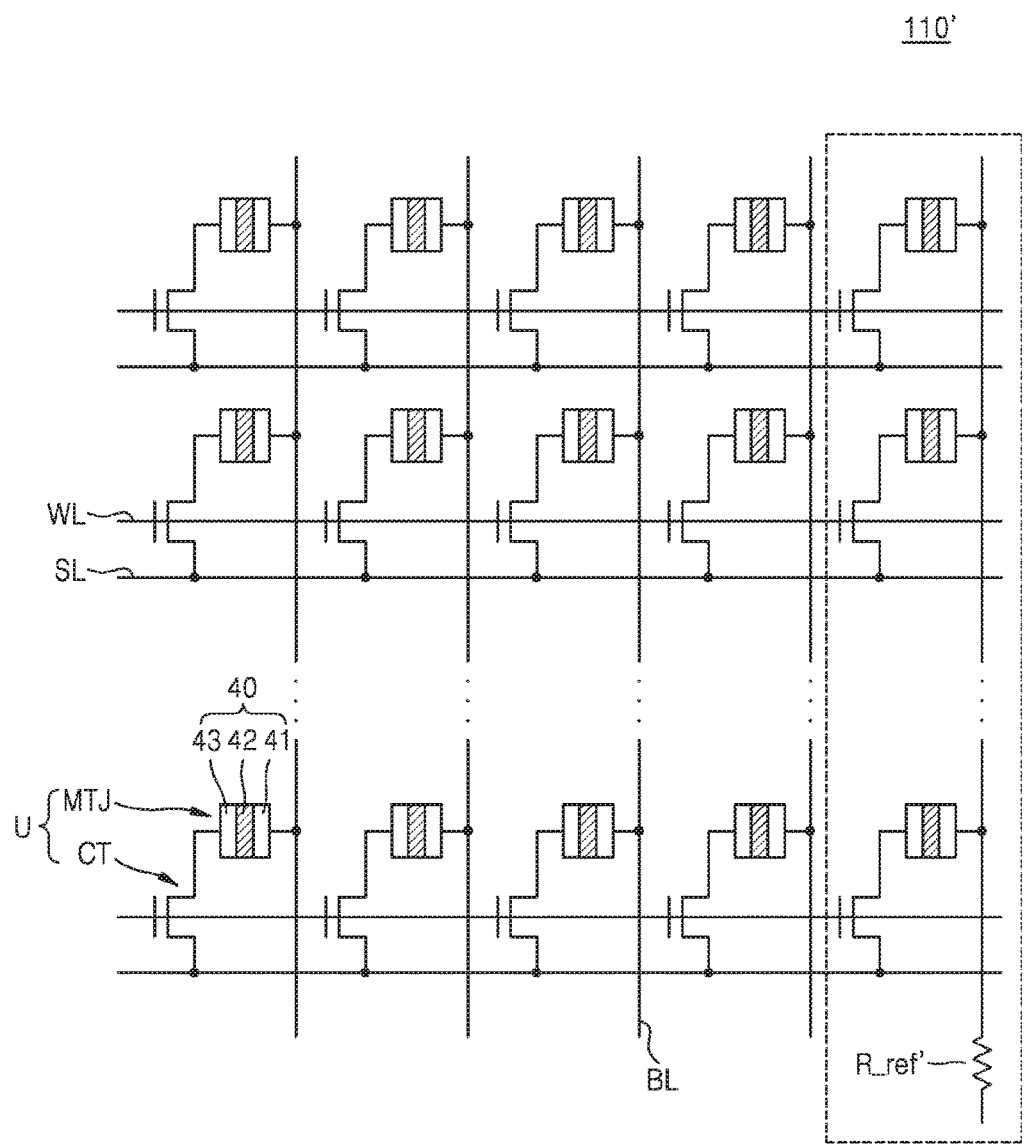

FIGS. 3A and 3B are respective circuit diagrams of memory cell arrays 110 and 110', respectively. The memory cell array may be, for example, the MRAM cell array.

Referring to FIG. 3A, the memory cell array 110 may include the multiple word lines WL, the multiple bit lines BL, multiple source lines SL, and multiple unit memory cells U arranged in a region where the word lines WL and the bit lines BL intersect each other. In addition, the memory cell array 110 may further include a reference cell R_ref.

One unit memory cell U may include a MTJ structure 40 and a cell transistor CT, and may be selected by selecting one bit line BL and one source line SL. For example, the memory cell array 110 may have a 1MTJ-1TR (transistor) structure.

The MTJ structure 40 may include a free layer 41, a barrier or tunnel layer 42, and a pinned layer 43. The free layer 41 may be connected to a bit line BL and the pinned layer 43 may be connected to a drain of the cell transistor CT. In addition, a source of the cell transistor CT may be connected to a source line SL and a gate of the cell transistor CT may be connected to a word line WL.

The MTJ structure 40 may be replaced by a resistive element such as the PRAM formed of a phase change material, the PRAM formed of a variable resistance material such as the complex metal oxide, and the like. In addition, the MTJ structure 40 may be replaced by a resistive element of the MRAM formed of a ferromagnetic material. Materials forming the resistive elements may have resistance values that vary depending on a magnitude and/or a direction of the current or the voltage, and may have a non-volatile characteristic such that the resistance value is maintained even when the current or the voltage is cut off.

The reference cell R_ref may be connected to a bit line BL to which the MTJ structure 40 is not connected. According to an example embodiment, the resistance value of the reference cell R_ref may change in accordance with the temperature change. For example, the resistance value of the reference cell R_ref may increase as the temperature thereof increases. As another example, the resistance value of the reference cell R_ref may decrease as the temperature thereof increases. The reference cell R_ref may include, for example, a poly-silicon resistor or a metal resistor.

The reference cell R_ref may be used as a comparison reference for reading data in the read operation of the memory cell array 110. For example, the memory cell read signal MC_S may be applied to the MTJ structure 40 for reading data stored in the MTJ structure 40. The reference cell read signal RC_S may be applied to the reference cell R_ref. Accordingly, the data stored in the MTJ structure 40 may be identified by comparing the sensing values caused by the memory cell read signal and the reference cell read signal, respectively.

Referring to FIG. 3B, the memory cell array 110' according to the present embodiment may be different from the memory cell array 110 of FIG. 3A in terms of a connection structure of the reference cell R_ref'. For example, the memory cell array 110 of FIG. 3A may have a structure in which the reference cell R_ref is connected to a bit line BL to which the MTJ structure 40 is not connected. However, the memory cell array 110 'of FIG. 3B may have a structure in which the reference cell R_ref' includes the MTJ structure 40 connected to one bit line BL and a resistor connected to the one bit line.

Figure 4:
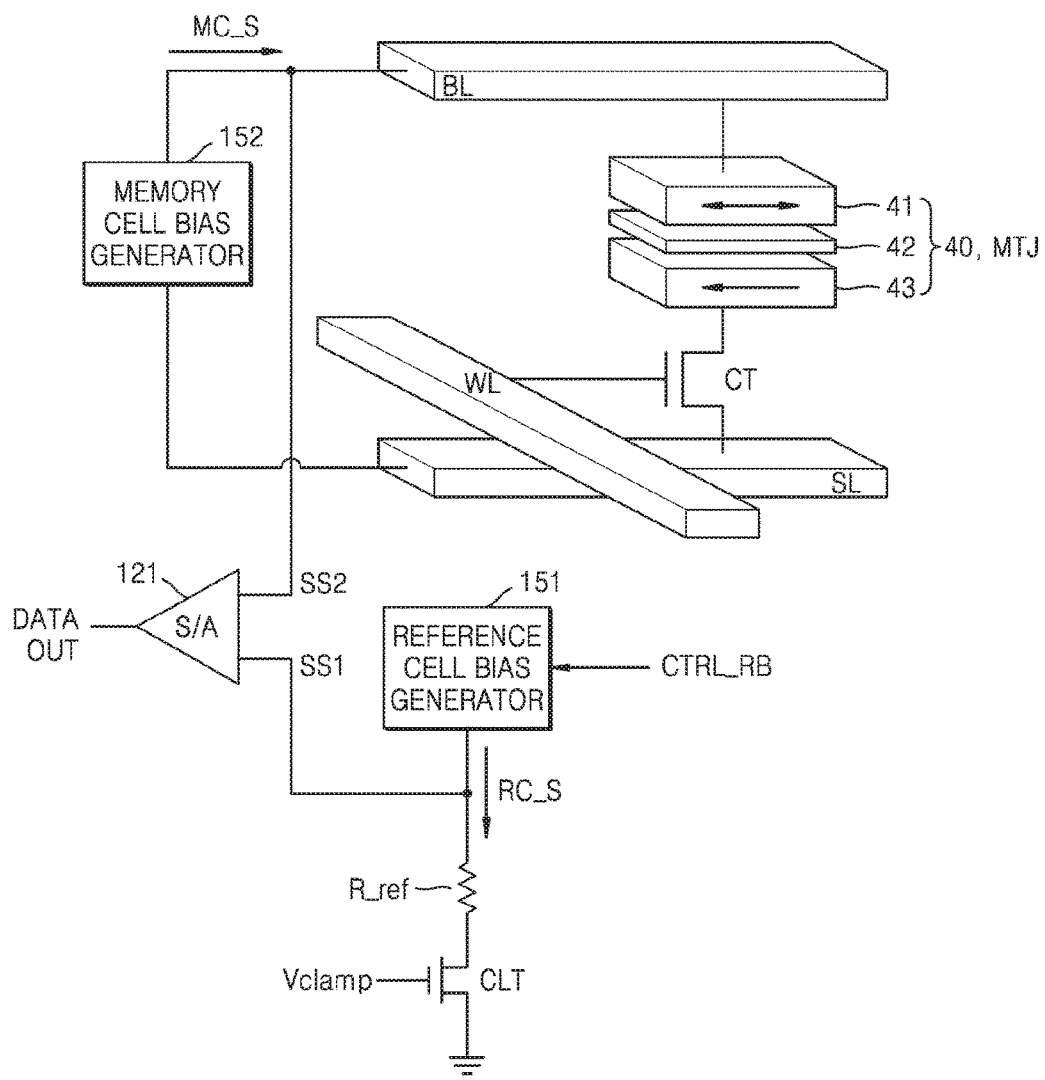
FIG. 4 is a perspective three-dimensional (3D) view of a unit memory cell U in FIG. 3A or 3B.

FIG. 4 is a perspective 3D view of the unit memory cell U in FIG. 3A or 3B.

Referring to FIG. 4, the reference cell R_ref may be connected to the reference cell bias generator 151, and the sensing amplifier 121 via one node, and may be connected to one electrode of a clamping transistor CLT, for example a drain electrode, via another node. Another electrode of the clamping transistor CLT, for example a source electrode, may be connected to ground.

The unit memory cell U may include the MTJ structure 40 and the cell transistor CT. The gate of the cell transistor CT may be connected to a word line WL, and one electrode of the cell transistor CT, for example the drain electrode, may be connected to a bit line BL via the MTJ structure 40. In addition, another electrode of the cell transistor CT, for example the source electrode, may be connected to a source line SL.

The MTJ structure 40 may include the free layer 41, the pinned layer 43, and the barrier or tunnel layer 42 therebetween. The magnetization orientation of the pinned layer 43 may be fixed and the magnetization orientation of the free layer 41 may be parallel or anti-parallel to the magnetization orientation of the pinned layer 43 depending on data stored by the write operation. In order to fix the magnetization orientation of the pinned layer 43, for example, an anti-ferromagnetic layer may be further provided.

According to an example embodiment, the reference cell bias generator 151 may apply the reference cell read signal RC_S to the reference cell R_ref for the read operation with respect to the unit memory cell U. In addition, a logic high voltage may be applied to the selected word line WL so that the cell transistor CT may be turned on. In addition, the memory cell bias generator 152 may apply the memory cell read signal MC_S to the selected bit line BL and the selected source line SL. Accordingly, the sensing amplifier 121 may sense a first sensing value SS1 caused by the reference cell read signal RC_S and a second sensing value SS2 caused by the memory cell read signal MC_S. The first sensing value SS1 and the second sensing value SS2 may be compared with each other for determining a logic state stored in the MTJ structure 40. Depending on a comparison result, the data stored in the MTJ structure 40 may be identified.

According to an example embodiment, the reference cell bias generator 151 may receive the reference cell bias control signal CTRL_RB and change the level of the reference cell read signal RC_S based on the reference cell bias control signal CTRL_RB. For example, the reference cell bias generator 151 may change the level of the reference cell read signal RC_S in accordance with the first ratio based on the reference cell bias control signal CTRL_RB. For example, the reference cell bias generator 151 may change the level of the reference cell read signal RC_S from the reference value to one of a first value and a second value based on the reference cell bias control signal CTRL_RB.

The clamping transistor CLT may be arranged for adjusting a level of the first sensing value SS1 by a certain amount and may be controlled by a clamping signal Vclamp. For example, the level of the first sensing value SS1 may be changed to a level suitable for being sensed by the sensing amplifier 121, by a clamping operation based on the clamping signal Vclamp.

Figure 5A:
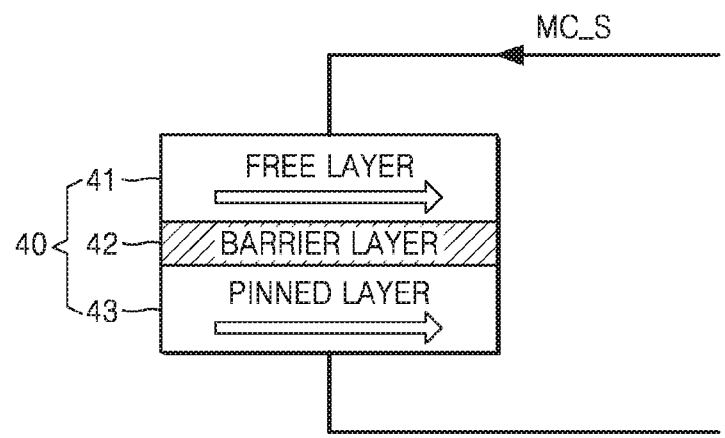
FIGS. 5A and 5B are conceptual diagrams describing data stored in accordance with a magnetization orientation in a magnetic tunnel junction (MTJ) structure in FIG. 4.
Figure 5B:
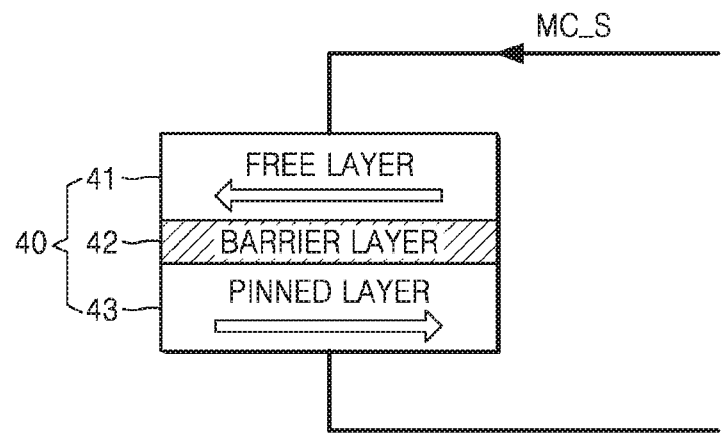

FIGS. 5A and 5B are conceptual diagrams describing data stored in accordance with a magnetization orientation in the MTJ structure in FIG. 4.

Referring to FIGS. 5A and 5B, the resistance value of the MTJ structure 40 may vary depending on the magnetization orientation of the free layer 41. When the memory cell read signal MC_S is applied to the MTJ structure 40, a data voltage in accordance with the resistance value of the MTJ structure 40 may be output. Since a strength of the memory cell read signal MC_S is much less than that of the write signal, the magnetization orientation of the free layer 41 may not be changed by the memory cell read signal MC_S.

As illustrated in FIG. 5A, the magnetization orientation of the free layer 41 and the magnetization orientation of the pinned layer 43 in the MTJ structure 40 may be arranged in parallel. The MTJ structure 40 in this state may have a low resistance value and thus, data of "0" may be output as a result of the read operation.

As illustrated in FIG. 5B, the magnetization orientation of the free layer 41 in the MTJ structure 40 may be arranged in anti-parallel with the magnetization orientation of the pinned layer 43. The MTJ structure 40 in this state may have a high resistance value and thus, data of "1" may be output as a result of the read operation.

Figure 6:
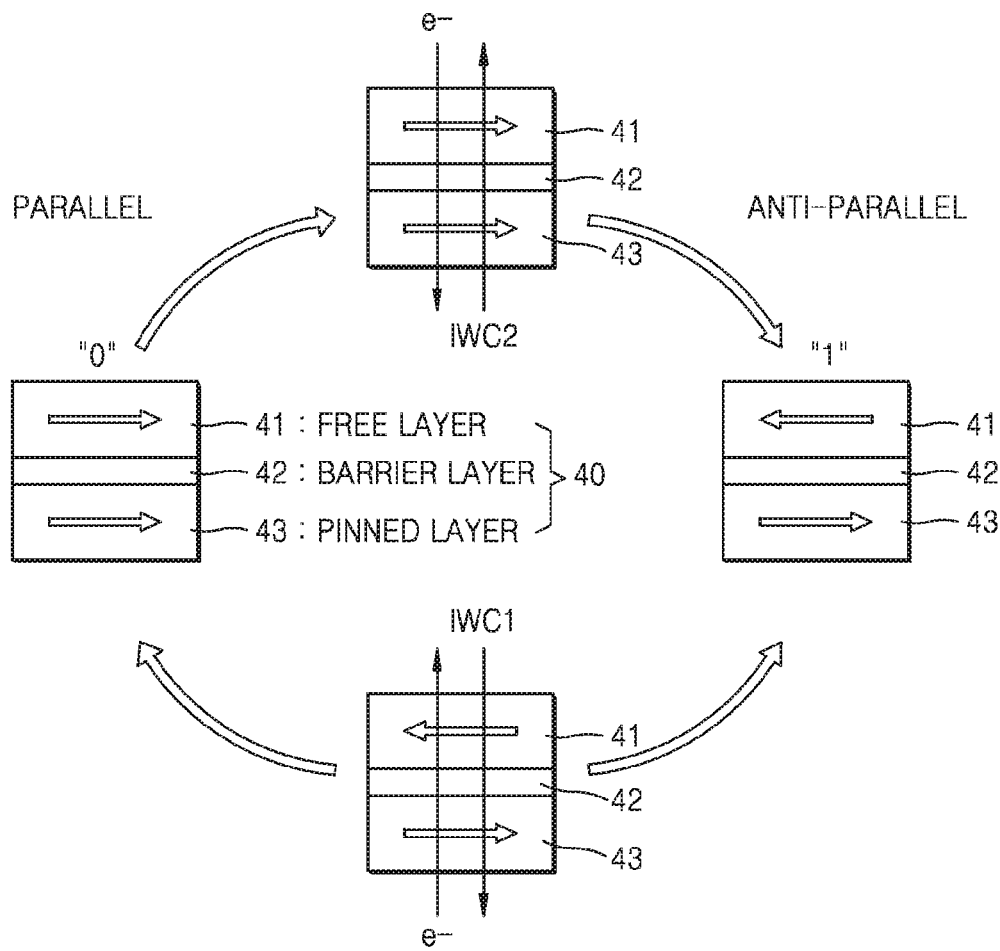
FIG. 6 is a block diagram describing a write operation with respect to the magnetic tunnel junction (MTJ) structure in FIG. 4.

FIG. 6 is a block diagram describing the write operation with respect to the MTJ structure in FIG. 4.

Referring to FIG. 6, the magnetization orientation of the free layer 41 may be determined, for example, in accordance with a direction of current flowing through the MTJ structure 40. For example, when a first write current IWC1 is applied from the free layer 41 to the pinned layer 43, free electrons having the same spin direction as the pinned layer 43 may apply torque to the free layer 41. As a result, the free layer 41 may be magnetized in parallel with the pinned layer 43.

When a second write current IWC2 is applied from the pinned layer 43 to the free layer 41, electrons having an opposite spin to the pinned layer 43 may return to the free layer 41 and apply the torque. As a result, the free layer 41 may be magnetized in anti-parallel with the pinned layer 43. In other words, the magnetization orientation of the free layer 41 in the MTJ structure 40 may be changed by a spin transfer torque (STT).

Figure 7A:
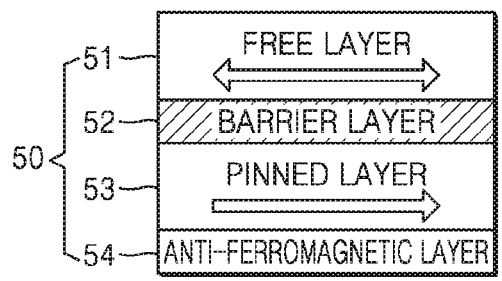
FIGS. 7A and 7B are diagrams illustrating other embodiments of the MTJ structure in FIG. 4.
Figure 7B:
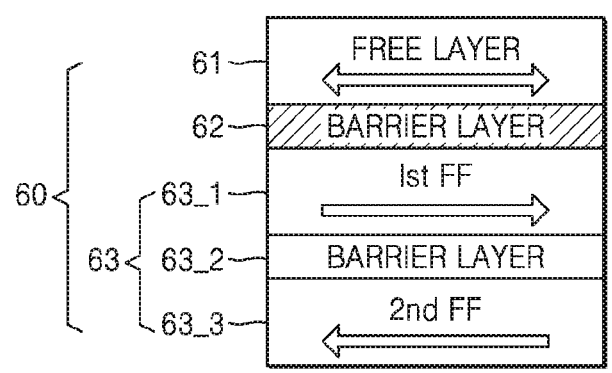

FIGS. 7A and 7B are diagrams illustrating other embodiments of the MTJ structure 40 in FIG. 4.

Referring to FIG. 7A, a MTJ structure 50 may include a free layer 51, a barrier layer 52, a pinned layer 53, and an anti-ferromagnetic layer 54. The free layer 51 may include a material having a changeable magnetization orientation. The magnetization orientation of the free layer 51 may be changed by electric/magnetic factors provided outside and/or inside of the memory cell. The free layer 51 may include the ferromagnetic material including at least one of Co, Fe, and Ni. For example, the free layer 51 may include at least one of FeB, Fe, Co, Ni, Gd, Dy, CoFe, NiFe, MnAs, MnBi, MnSb, CrO2, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The barrier layer 52 may have a thickness less than a spin diffusion distance. The barrier layer 52 may include a non-magnetic material. As an example, the barrier layer 52 may include at least one of oxides including Mg, Ti, Al, or MgZn, and MgB, and nitrides including Ti or V.

The pinned layer 53 may have the magnetization orientation fixed by the anti-ferromagnetic layer 54. In addition, the pinned layer 53 may include the ferromagnetic material. For example, the pinned layer 53 may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer 54 may include the anti-ferromagnetic material. For example, the anti-ferromagnetic layer 54 may include at least one of PtMn, IrMn, MnO, MnS, MnTe, $MnF_2$, $FeCl_2$, FeO, $CoCl_2$, CoO, $NiCl_2$, NiO, and Cr.

Since the free layer 51 and the pinned layer 53 of the MTJ structure 50 are formed of the ferromagnetic material, a stray field may occur at an edge of the ferromagnetic material. The stray field may decrease a magnetic resistance or increase a resistive magnetic force of the free layer 51. In addition, the stray field may influence switching characteristics and cause asymmetrical switching. Thus, a structure is needed for reducing or controlling the stray field generated by the ferromagnetic material in the MTJ structure 50.

Referring to FIG. 7B, a pinned layer 63 of a MTJ structure 60 may include a synthetic anti-ferromagnetic (SAF) material. The pinned layer 63 may include a first ferromagnetic layer 63_1 (1st FF), a barrier layer 63_2, and a second ferromagnetic layer 63_3 (2nd FF). The first ferromagnetic layer 63_1 (1st FF) and second ferromagnetic layer 63_3 (2nd FF) may respectively include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In this case, the magnetization orientation of the first ferromagnetic layer 63_1 (1st FF) and the magnetization orientation of the second ferromagnetic layer 63_3 (2nd FF) may have different directions from each other, and respective magnetization orientations thereof may be fixed. The barrier layer 63_2 may include Ru.

Figure 8:
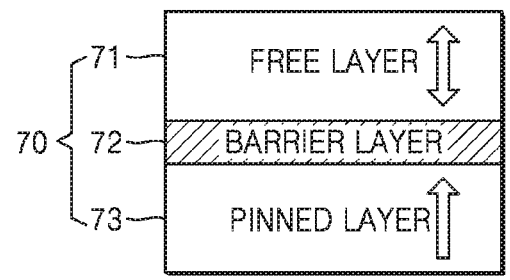
FIG. 8 is a diagram illustrating another embodiment of the MTJ structure in FIG. 4.

FIG. 8 is a diagram illustrating another embodiment of the MTJ structure 40 in FIG. 4.

Referring to FIG. 8, the magnetization orientation of a MTJ structure 70 may be vertical, and a moving direction of the current and an easy axis of magnetization may be substantially in parallel. The MTJ structure 70 may include a free layer 71, a barrier layer 72, and a pinned layer 73. When the magnetization orientation of the free layer 71 and the magnetization orientation of the pinned layer 73 are in parallel, the resistance value may decrease. When the magnetization orientation of the free layer 71 and the magnetization orientation of the pinned layer 73 are in anti-parallel, the resistance value may increase. Data may be stored in the MTJ structure 70 in accordance with the resistance value.

In order to realize the MTJ structure 70 having a vertical magnetization orientation, it may be preferable that the free layer 71 and the pinned layer 73 include a material having a large magnetic anisotropic energy. Materials having the large magnetic anisotropic energy may include amorphous rare earth element alloys, multi-layer thin films including (Co/Pt)n or (Fe/Pt)n, and ordered-lattice materials having a L10 crystal structure. For example, the free layer 71 may be an ordered alloy and include at least one of Fe, Co, Ni, Pa, and Pt. In addition, the free layer 71 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, for example, in chemical quantitative terms, Fe50Pt50, Fe50Pd50, Co50Pd50, Co50Pt50, Fe30Ni20Pt50, Co30Fe20Pt50, or Co30Ni20Pt50.

The pinned layer 73 may be the ordered alloy and include at least one of Fe, Co, Ni, Pa, and Pt. For example, the pinned layer 73 may include at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. Such alloys may be, for example, in the chemical quantitative terms, Fe50Pt50, Fe50Pd50, Co50Pd50, Co50Pt50, Fe30Ni20Pt50, Co30Fe20Pt50, or Co30Ni20Pt50.

Figure 9A:
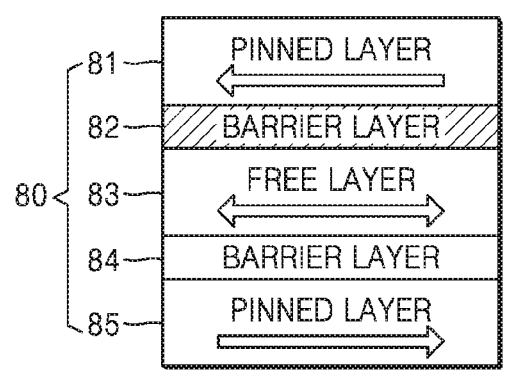
FIGS. 9A and 9B are diagrams illustrating other embodiments of the MTJ structure in FIG. 4.
Figure 9B:
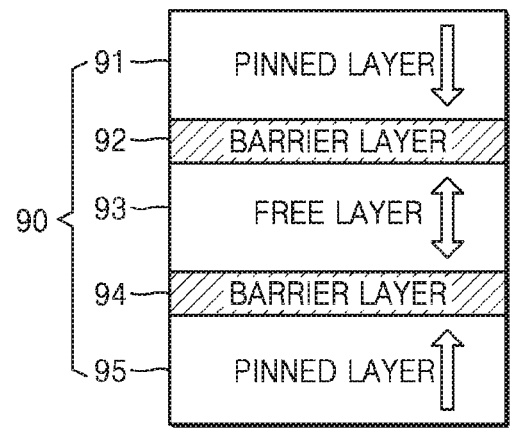

FIGS. 9A and 9B are diagrams illustrating other embodiments of the MTJ structure 40 in FIG. 4. A dual MTJ structure may be a structure in which a barrier layer and a pinned layer are respectively arranged at both ends with respect to a free layer.

Referring to FIG. 9A, a dual MTJ structure 80 forming a horizontal magnetism may include a first pinned layer 81, a first barrier layer 82, a free layer 83, a second barrier layer 84, and a second pinned layer 85. The first pinned layer 81 and second pinned layer 85 may be similar to the pinned layer 53 in FIG. 7A. The first barrier layer 82 and second barrier layer 84 may be similar to the barrier layer 52 in FIG. 7A. The free layer 83 may be similar to the free layer 51 in FIG. 7A.

When the magnetization orientation of the first pinned layer 81 and the magnetization orientation of the second pinned layer 85 are fixed in the opposite direction, magnetic forces due to the first pinned layer 81 and second pinned layer 85 may be substantially canceled out. Thus, the dual MTJ structure 80 may execute the write operation using less current than a conventional MTJ structure.

The dual MTJ structure 80 may provide an advantage of providing a clear data value because the dual MTJ structure 80 provides a high resistance in the read operation due to the second barrier layer 84.

Referring to FIG. 9B, a dual MTJ structure 90 forming a vertical magnetism may include a first pinned layer 91, a first barrier layer 92, a free layer 93, a second barrier layer 94, and a second pinned layer 95. The first pinned layer 91 and second pinned layer 95 may be similar to the pinned layer 73 in FIG. 8. The first barrier layer 92 and second barrier layer 94 may be similar to the barrier layer 72 in FIG. 8. The free layer 93 may be similar to the free layer 71 in FIG. 8.

In this case, when the magnetization orientation of the first pinned layer 91 and the magnetization orientation of the second pinned layer 95 are fixed in opposite directions, the magnetic force due to the first pinned layer 91 and second pinned layer 95 may be substantially canceled out. Thus, the dual MTJ structure 90 may execute the write operation using less current than the conventional MTJ structure.

Figure 10A:
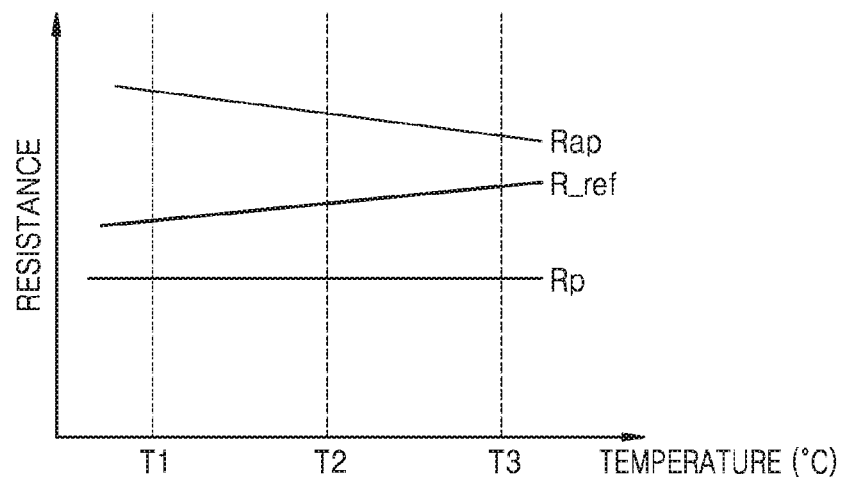
FIGS. 10A through 10C are graphs illustrating changes in various read factors illustrated in FIG. 4, based on a temperature change, according to an example embodiment.
Figure 10B:
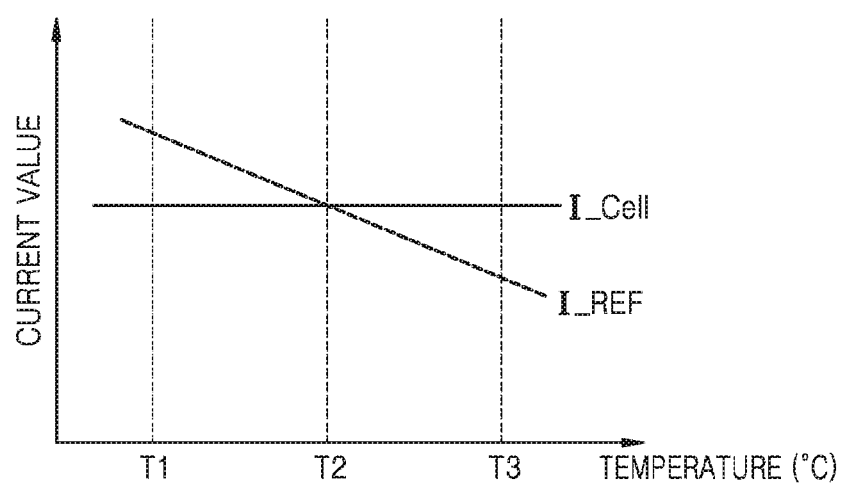
Figure 10C:
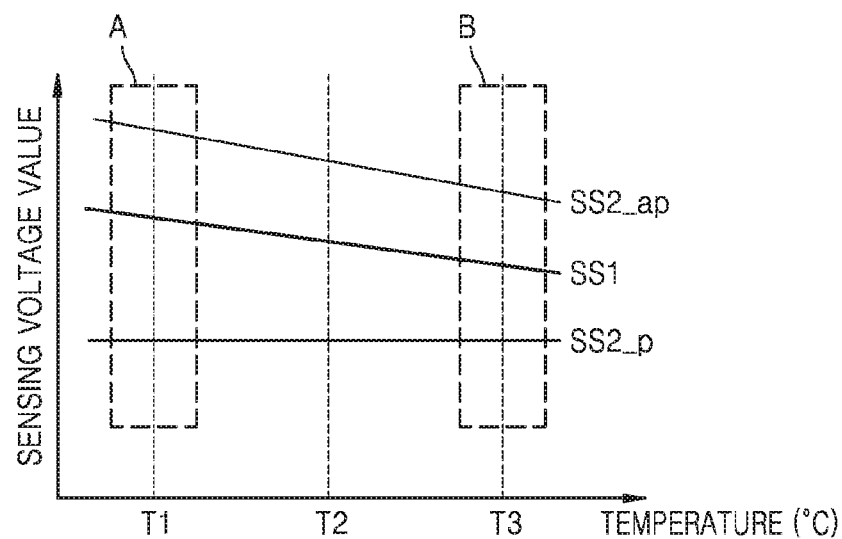

FIGS. 10A through 10C are graphs illustrating changes in various read factors illustrated in FIG. 4 based on a temperature change, according to an example embodiment. FIG. 10A shows changes in the resistance value of the reference cell and a memory cell in accordance with the temperature change. FIG. 10B shows changes in the reference cell read current and the memory cell read current in accordance with the temperature change. FIG. 10C shows respective changes in the first and second sensing values in accordance with the temperature change. In FIGS. 10A through 10C, a temperature T2 may be higher than a temperature T1 and may be lower than a temperature T3.

Referring to FIG. 10A, as the temperature increases, the resistance value of the reference cell R_ref may increase. The reference cell R_ref may have, for example, polysilicon resistance. In the case of the unit memory cell U, the resistance value may change in a different manner from the reference cell R_ref as the temperature increases. When the unit memory cell U has a high resistance value Rap, for example, when the magnetization orientation of the free layer 41 and the magnetization orientation of the pinned layer 43 are arranged in anti-parallel in the MTJ structure 40, the resistance value Rap may decrease as the temperature increases. When the unit memory cell U has a low resistance value Rp, for example, when the magnetization orientation of the free layer 41 and the magnetization orientation of the pinned layer 43 are arranged in parallel in the MTJ structure 40, a change in the resistance value Rp with respect to the temperature change may not be large compared with the case where the magnetization orientation of the free layer 41 and the magnetization orientation of the pinned layer 43 are arranged in a half-parallel manner.

Referring to FIG. 10B, the reference cell read current I_REF applied to the reference cell R_ref may be changed and output, as the temperature changes. According to an example embodiment, the reference cell bias generator 151 may output the reference cell read current I_REF to the reference cell R_ref based on the reference cell bias control signal CTRL_RB that has been output based on the result of the detecting of the temperature. For example, the reference cell bias generator 151 may change the reference cell read current I_REF in accordance with the first ratio and output a result of the change, when the temperature increases. In addition, the reference cell bias generator 151 may change the reference cell read current I_REF in accordance with a second ratio and output a result of the change, when the temperature decreases.

According to an example embodiment, the first ratio and second ratio may have opposite signs. For example, the first ratio may have a negative (−) sign and the second ratio may have a positive (+) sign. Absolute values of the first ratio and the second ratio may be equal to each other, but are not limited thereto.

In other words, for example, when the value of the reference cell read current I_REF at the temperature T2 is the reference value, the reference cell read current I_REF may be changed from the reference value to the first value having a level lower than the reference value as the temperature increases. In addition, the reference cell read current I_REF may be changed from the reference value to the second value having a level higher than the reference value as the temperature decreases.

According to an example embodiment, the memory cell read current I_Cell applied to the unit memory cell U may be output to a constant value regardless of the temperature change. However, the present disclosure is not limited thereto and the memory cell read current I_Cell may also be changed in accordance with the temperature like the reference cell read current I_REF.

Referring to FIG. 10C, the first sensing value SS1 and the second sensing value SS2 respectively resulting from the reference cell read current I_REF and the memory cell read current I_Cell may be changed in the same manner as the temperature changes. When the unit memory cell U has a high resistance value, a level of a high second sensing value SS2_ap output by applying the memory cell read current I_Cell to the unit memory cell U may decrease as the temperature rises. In addition, the level of the first sensing value SS1 output by applying the reference cell read current I_REF to the reference cell R_ref may decrease as the temperature increases. On the other hand, when the unit memory cell U has a low resistance value, a low second sensing value SS2_p may not have a significant level change with respect to the temperature, in comparison with the case where the unit memory cell U has a high resistance value.

Figure 11A:
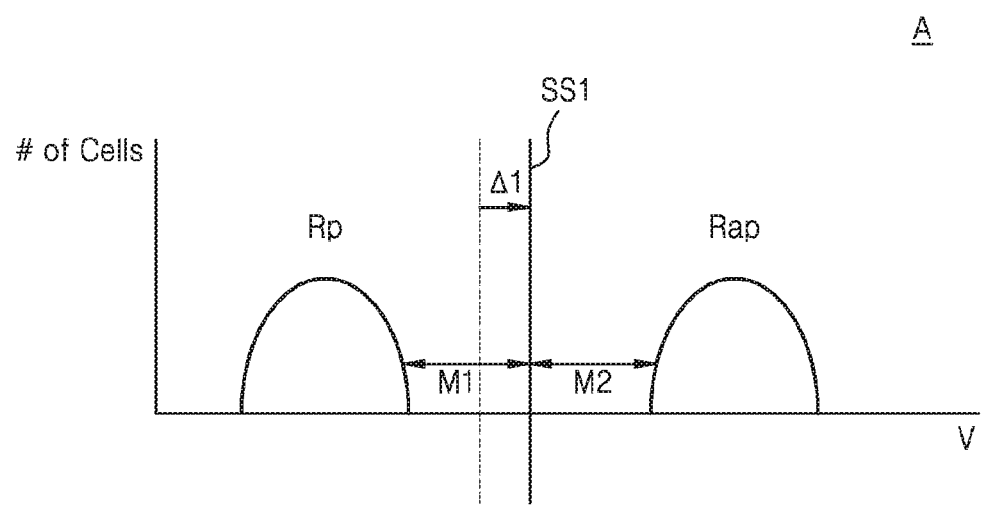
FIGS. 11A and 11B are graphs illustrating dispersions and sensing values of memory cells at each temperature illustrated in FIG. 10C.
Figure 11B:
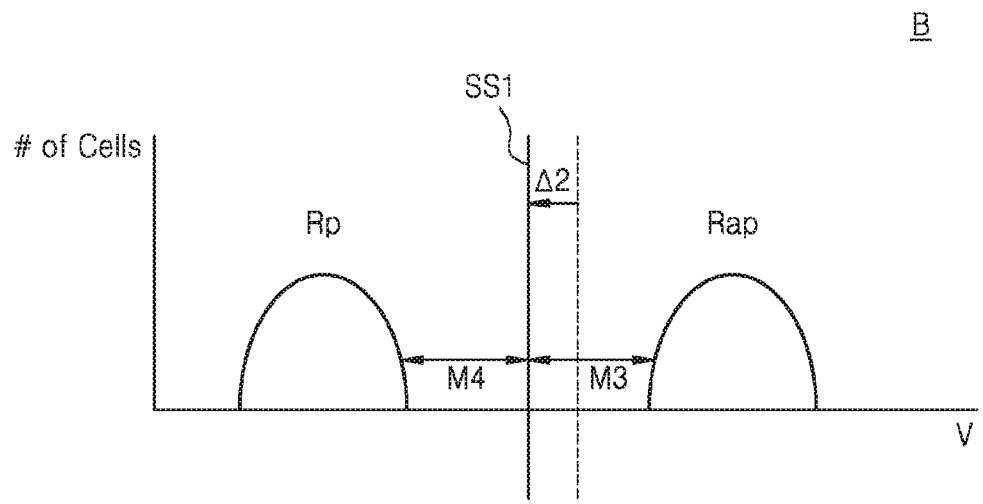

FIGS. 11A and 11B are graphs illustrating dispersions and sensing values of memory cells at each temperature illustrated in FIG. 10C. FIG. 11A illustrates the dispersion and the first sensing values of the memory cells at the temperature T1 of FIG. 10C. FIG. 11B illustrates the dispersion and the first sensing values of the memory cells at the temperature T3 of FIG. 10C.

In addition, in FIGS. 11A and 11B, a case is illustrated where each memory cell may be the SLC storing data of one bit, and a horizontal axis may represent voltage and a vertical axis may represent the number of memory cells. In addition, the cell dispersion illustrated on the right side of the figure may represent the dispersion of memory cells having a relatively high resistance value, and the cell dispersion illustrated on the left side of the figures may represent the dispersion of memory cells having a relatively small resistance value.

Referring to FIG. 11A, at the temperature T1, the first sensing value SS1 may be moved by Δ1 to the dispersion in a state of high resistance value Rap due to a temperature-based change, according to an embodiment of the present disclosure. Accordingly, a first margin M1 between the first sensing value SS1 and the dispersion in a state of the low resistance value Rp may be balanced with a second margin M2 between the first sensing value SS1 and the dispersion in a state of the high resistance value Rap. In other words, at the temperature T1, a sensing margin between the first sensing value SS1 and adjacent cell dispersion may be secured.

Referring to FIG. 11B, at the temperature T3, the first sensing value SS1 may be moved by Δ2 to the dispersion in a state of low resistance value Rp due to a temperature-based change, according to an embodiment of the present disclosure. Accordingly, a third margin M3 between the first sensing value SS1 and the dispersion in a state of the high resistance value Rap may be balanced with a fourth margin M4 between the first sensing value SS1 and the dispersion in a state of the low resistance value Rp. In other words, at the temperature T3, the sensing margin between the first sensing value SS1 and adjacent cell dispersion may be secured.

According to the present disclosure, a memory device may control a temperature dependence of a read signal so that a sensing value of a reference cell is determined, regardless of temperature, between the sensing value of a memory cell in a parallel state and the sensing value of the memory cell in an anti-parallel state. Thus, the memory device according to an example embodiment of the present disclosure may increase a read margin and improve reliability of data, regardless of the temperature change.

Figure 12:
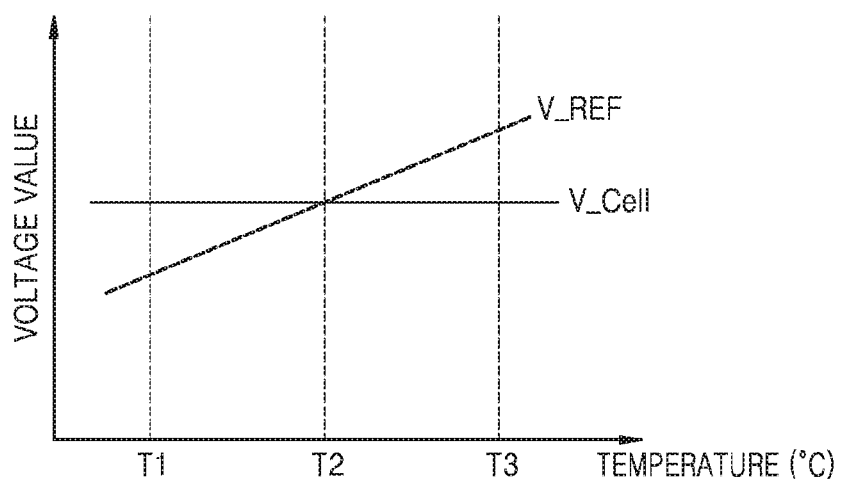
FIG. 12 illustrates a change in a read signal based on a temperature change, according to another example embodiment of the present disclosure.

FIG. 12 illustrates a change in a read signal based on a temperature change, according to another example embodiment of the present disclosure. FIG. 12 is a graph illustrating changes in the reference cell read voltage V_REF and the memory cell read voltage V_Cell when the read signals respectively applied to each of the reference cell R_ref and the unit memory cell U in FIG. 3A or FIG. 3B are of a voltage type.

Referring to FIG. 12, the reference cell read voltage V_REF applied to the reference cell R_ref may be changed and output, as the temperature changes. According to an example embodiment, the reference cell bias generator 151 may output the reference cell read voltage V_REF to the reference cell R_ref based on the reference cell bias control signal CTRL_RB that has been output based on the result of the detecting of the temperature.

For example, when the temperature increases, the reference cell bias generator 151 may change the reference cell read voltage V_REF in accordance with the first ratio and output a result of the change. In addition, when the temperature decreases, the reference cell bias generator 151 may change the reference cell read voltage V_REF in accordance with the second ratio and output a result of the change. According to an example embodiment, the first ratio and second ratio may have opposite signs. For example, the first ratio may have the negative (−) sign and the second ratio may have the positive (+) sign. The absolute values of the first ratio and the second ratio may be the same, but are not limited thereto.

In other words, for example, when the value of the reference cell read voltage V_REF at the temperature T2 is the reference value, the reference cell read voltage A_REF may be changed from the reference value to a first value having a level higher than the reference value as the temperature increases. In addition, when the temperature decreases, the reference cell read voltage V_REF may be changed from the reference value to a second value having a level lower than the reference value.

According to an example embodiment, the memory cell read voltage V_Cell applied to the unit memory cell U may be output to a constant value regardless of the temperature change. However, the memory cell read voltage V_Cell is not limited thereto and the memory cell read voltage V_Cell may also be changed and output in accordance with the temperature like the reference cell read voltage V_REF.

Figure 13A:
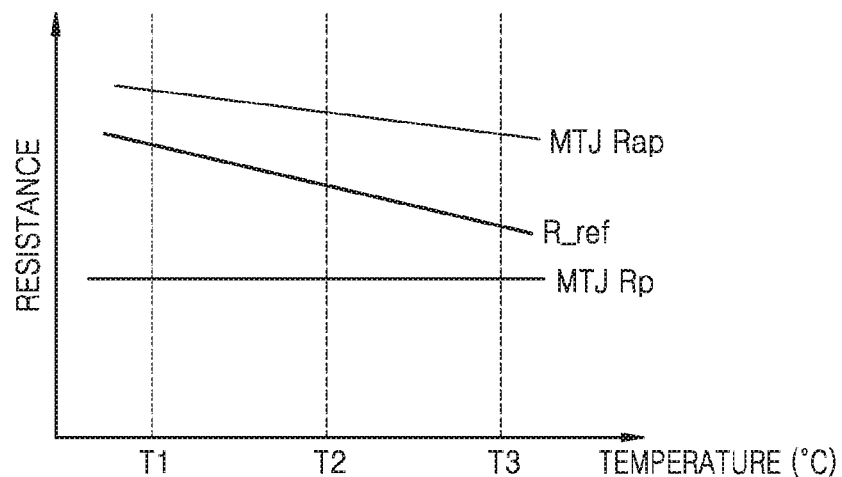
FIGS. 13A and 13B are graphs showing changes in various read factors illustrated in FIG. 4 based on the temperature change, according to an example embodiment.
Figure 13B:
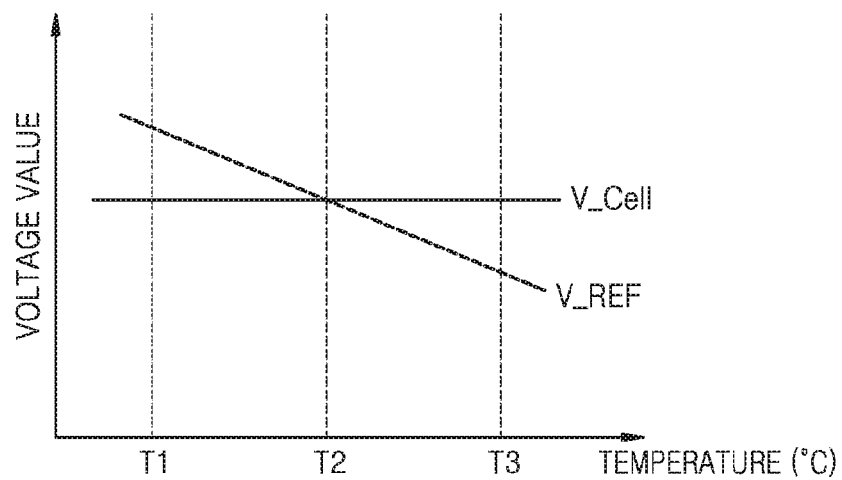

FIGS. 13A and 13B are graphs showing changes in various read factors illustrated in FIG. 4 based on the temperature change, according to an example embodiment.

Referring to FIG. 13A, the resistance value of the reference cell R_ref may decrease, as the temperature increases. The reference cell R_ref may have, for example, a metal resistance. In the case of the unit memory cell U, the increase/decrease characteristics based on the temperature is overlapped with the description for FIG. 10A and thus, will be omitted.

Referring to FIG. 13B, the reference cell read voltage V_REF applied to the reference cell R_ref may be changed and output, as the temperature changes. According to an example embodiment, the reference cell bias generator 151 may output the reference cell read current I_REF to the reference cell R_ref based on the reference cell bias control signal CTRL_RB that has been output based on the result of the detecting of the temperature. For example, when the temperature increases, the reference cell bias generator 151 may change the reference cell read voltage V_REF in accordance with the first ratio and output a result of the change. In addition, when the temperature decreases, the reference cell bias generator 151 may change the reference cell read voltage V_REF in accordance with the second ratio and output a result of the change.

According to an example embodiment, the first ratio and second ratio may have opposite signs. For example, the first ratio may have the negative (−) sign and the second ratio may have the positive (+) sign. The absolute values of the first ratio and the second ratio may be the same, but are not limited thereto.

In other words, for example, when the value of the reference cell read voltage V_REF at the temperature T2 is the reference value, the reference cell read voltage A_REF may be changed from the reference value to the first value having a level lower than the reference value as the temperature increases. In addition, when the temperature decreases, the reference cell read voltage V_REF may be changed from the reference value to the second value having a level higher than the reference value.

Figure 14:
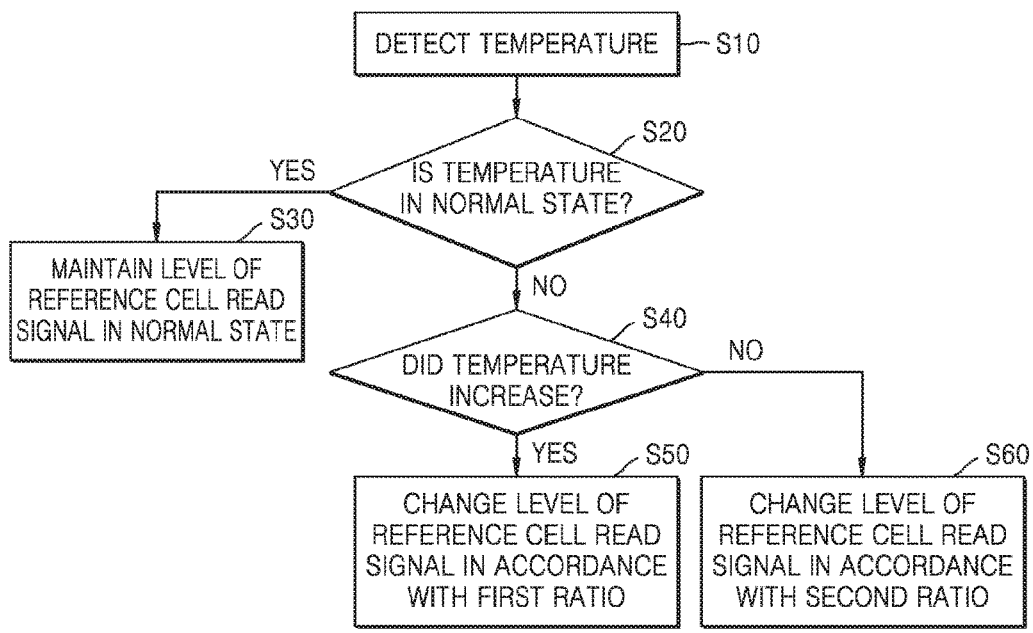
FIG. 14 is a flowchart of operations of a memory device, according to an example embodiment of the present disclosure.

FIG. 14 is a flowchart of operations of a memory device, according to an example embodiment of the present disclosure. FIG. 14 may be a flowchart, for example, for operations of the memory device 100 illustrated in FIG. 2.

Referring to FIG. 14, an operation of detecting the temperature of the memory device 100 may be firstly performed (S10). The detecting temperature may be executed, for example, at the temperature sensor 140. The temperature may be detected in various methods and, for example, whether the temperature inside the memory device 100 is higher or lower than a predetermined temperature (or, a certain range) corresponding to a normal state may be detected. The temperature sensor 140 may output the detected temperature information signal T of the memory device 100 to the control logic 130.

Temperature compensation may be executed in the read operation of the memory device 100 in accordance with the result of the detecting of the temperature. The read operation of the memory cell array 110 may be executed by various methods and, for example, the current sensing method or the voltage sensing method as described in previous embodiments may be applied.

After the temperature of the memory device 100 is detected, whether the detected temperature is in a normal state may be determined (S20). For example, the control logic 130 receiving the temperature information signal T may determine whether the temperature is in a normal state. When the detected temperature is in the normal state (S20=Yes), the level of the reference cell read signal RC_S may be maintained as a reference value (S30). For example, the reference cell read signal RC_S may be the reference cell read current I_REF in FIG. 6B. As another example, the reference cell read signal RC_S may be the reference cell read voltage V_REF in FIG. 8.

When the detected temperature is not in the normal state (S20=No), whether the temperature of the memory device 100 has increased may be determined (S40). When the temperature of the memory device 100 rises (S40=Yes), the level of the reference cell read signal RC_S may be changed in accordance with the first ratio (S50). When the temperature of the memory device 100 decreases (S40=No), the level of the reference cell read signal RC_S may be changed in accordance with the second ratio (S60).

According to an example embodiment, the first ratio and second ratio may have opposite signs. For example, the first ratio may have the negative (−) sign and the second ratio may have the positive (+) sign. In other words, when the temperature increases, the reference cell read signal RC_S may be changed from the reference value to the first value having a level lower than the reference value. In addition, when the temperature decreases, the reference cell read current I_REF may be changed from the reference value to the second value having a level higher than the reference value.

As another example, the first ratio may have the positive sign and the second ratio may have the negative sign. In other words, when the temperature increases, the reference cell read signal RC_S may be changed from the reference value to a third value having a level higher than the reference value. In addition, when the temperature decreases, the reference cell read signal RC_S may be changed from the reference value to a fourth value having a level lower than the reference value.

Figure 15:
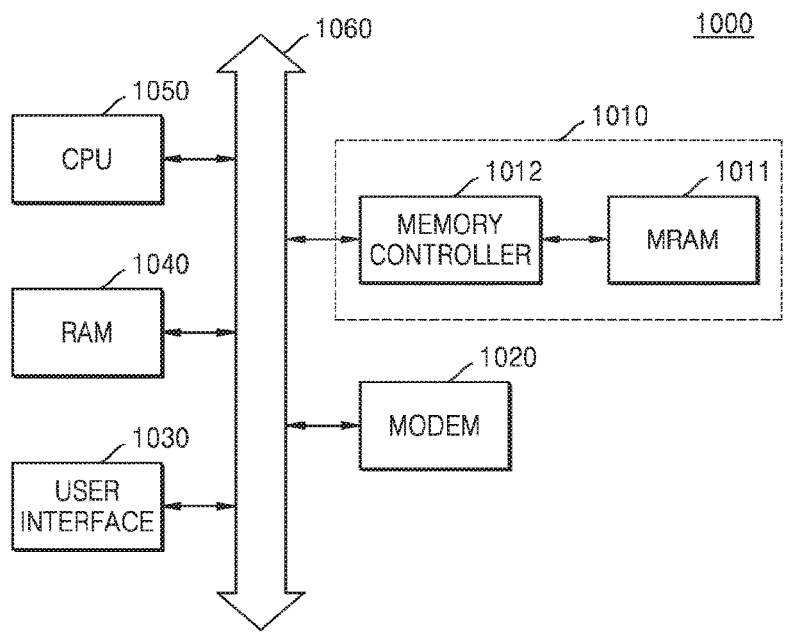
FIG. 15 is a block diagram illustrating an example of an information processing system including a memory device, according to the present disclosure.

FIG. 15 is a block diagram illustrating an example of an information processing system including a memory device 1011, according to the present disclosure.

Referring to FIG. 15, the memory device 1011 may be mounted on a computer system 1000 such as a mobile device and a desktop computer. The computer system 1000 may include a memory system 1010, a modem 1020, a user interface 1030, a RAM 1040, and a CPU 1050, which are electrically connected to a system bus 1060. The memory device 1011 may be an MRAM chip including a STT-MRAM cell and the memory system 1010 may be an MRAM system including an MRAM chip. Although not illustrated, it is apparent to one of ordinary skill in the art that the computer system 1000 may further include an application chipset, a camera image processor (CIP), an input/output device, and the like.

The memory system 1010 may include the memory device 1011 and a memory controller 1012. The memory device 1011 may store data processed by the CPU 1050 or data input externally. In this case, the memory device 1011 may be realized by using embodiments described above with reference to FIGS. 1 through 14.

While the inventive concepts of the present disclosure have been particularly shown and described with reference to embodiments thereof, it will be understood that various changes in form and details may be made therein without departing from the spirit and scope of the following claims.

What is claimed is:

1. A memory device, comprising:
a memory cell array including at least one reference cell and a plurality of memory cells;
a temperature sensor configured to detect a temperature of the memory device;
a reference cell bias generator configured to control a first level of a first read signal applied to the at least one reference cell in accordance with the detected temperature; and
a sensing amplifier configured to compare a first sensing value output from the at least one reference cell based on the first read signal with a second sensing value output from a memory cell selected from the plurality of memory cells based on a second read signal with a second level determined independent from the first level of the first read signal.

2. The memory device of claim 1, wherein the reference cell bias generator controls the first level of the first read signal by changing the first level of the first read signal in accordance with a first ratio when the temperature of the memory device increases and by changing the first level of the first read signal in accordance with a second ratio when the temperature of the memory device decreases.

3. The memory device of claim 2,
wherein the first read signal is a current signal, and the first ratio has a negative (−) sign, and the second ratio has a positive (+) sign, and
the first read signal varies with the detected temperature and the second read signal does not vary with the detected temperature.

4. The memory device of claim 2, wherein the first read signal is a voltage signal, and the first ratio has a positive (+) sign, and the second ratio has a negative (−) sign, and
the first read signal varies with the detected temperature and the second read signal does not vary with the detected temperature.

5. The memory device of claim 1, wherein the reference cell bias generator changes the first level of the first read signal applied to the at least one reference cell from a reference value to a first value when the temperature of the memory device increases, and changes the first level of the first read signal from the reference value to a second value different from the first value when the temperature of the memory device decreases.

6. The memory device of claim 5, wherein the first value is greater than the reference value and the second value is less than the reference value.

7. The memory device of claim 5, wherein the first value is less than the reference value and the second value is greater than the reference value.

8. The memory device of claim 1, wherein the at least one reference cell has poly-silicon resistance.

9. The memory device of claim 1, wherein the plurality of memory cells comprise spin transfer torque magnetic random access memory (STT-MRAM) memory cells.

10. A method of operating a memory device including at least one reference cell and a plurality of memory cells, the method of operating the memory device comprising:
   detecting a temperature of the memory device;
   controlling a first level of a first read signal applied to the at least one reference cell in accordance with a result of the detecting of the temperature; and
   comparing a first sensing value sensed by applying the first read signal to the at least one reference cell with a second sensing value sensed by applying a second read signal with a second level determined independent of the first level of the first read signal to a selected memory cell among the plurality of memory cells.

11. The method of operating the memory device of claim 10, wherein the controlling of the first level of the first read signal comprises controlling the first level of the first read signal by changing the first level of the first read signal in accordance with a first ratio when the temperature of the memory device increases and by changing the first level of the first read signal in accordance with a second ratio when the temperature of the memory device decreases.

12. The method of operating the memory device of claim 11, wherein the first ratio and the second ratio have opposite signs, and
   the first read signal varies with the result of the detecting of the temperature and the second read signal does not vary with the result of the detecting of the temperature.

13. The method of operating the memory device of claim 10, wherein the controlling of the first level of the first read signal comprises changing the first level of the first read signal applied to the at least one reference cell from a reference value to a first value when the temperature of the memory device increases, and changing the first level of the first read signal applied to the at least one reference cell from the reference value to a second value different from the first value when the temperature of the memory device decreases.

14. The method of operating the memory device of claim 10, wherein the controlling of the first level of the first read signal comprises maintaining the first level of the first read signal at a reference value when it is determined that the detected temperature is in a predetermined normal state as a result of the detecting of the temperature.

15. The method of operating the memory device of claim 10, wherein the memory device comprises a reference cell bias generator that generates the first read signal and a memory cell bias generator that is separate from the reference cell bias generator and that generates the second read signal, and the method further comprising providing to the reference cell bias generator a control signal for changing the first read signal in accordance with a result of the detecting of the temperature.

16. A memory device, comprising:
   a memory cell array that includes a reference cell and a plurality of memory cells;
   a temperature sensor configured to detect a temperature of the memory device; and
   a sensing amplifier configured to compare a first value output from the reference cell based on a first read signal with a first read level with a second value output from a memory cell based on a second read signal with a second read level determined independent from the first read level of the first read signal, to determine a value of data in the memory cell,
   wherein the value output from the reference cell is controlled in accordance with the detected temperature, such that the value of the data in the memory cell varies in accordance with the detected temperature.

17. The memory device of claim 16, further comprising:
   a bias generator that controls the first read signal with the first read level to the reference cell based on the detected temperature, such that the first value output from the reference cell is changed based on the detected temperature,
   wherein the second read signal does not vary with the detected temperature.

18. The memory device of claim 17,
   wherein the first read signal varies in accordance with a predetermined relationship between temperature of the memory device and the first read signal.

19. The memory device of claim 18, wherein the first read signal is a current signal.

20. The memory device of claim 18, wherein the second read signal is a voltage signal.

* * * * *